(12) United States Patent
Ong et al.

(10) Patent No.: US 12,009,026 B2
(45) Date of Patent: Jun. 11, 2024

(54) PRECISE WRITING OF MULTI-LEVEL WEIGHTS TO MEMORY DEVICES FOR COMPUTE-IN-MEMORY

(71) Applicant: Intel Corporation, Santa Clara, CA (US)

(72) Inventors: Clifford Ong, Portland, OR (US); Yu-Lin Chao, Portland, OR (US); Dmitri E. Nikonov, Beaverton, OR (US); Ian Young, Portland, OR (US); Eric A. Karl, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 668 days.

(21) Appl. No.: 17/117,795

(22) Filed: Dec. 10, 2020

(65) Prior Publication Data

US 2021/0098059 A1    Apr. 1, 2021

(51) Int. Cl.
*G11C 11/54*      (2006.01)
*G06F 3/06*       (2006.01)
*G11C 7/10*       (2006.01)
*G11C 11/56*      (2006.01)
*G11C 7/06*       (2006.01)
*G11C 7/22*       (2006.01)

(52) U.S. Cl.
CPC ............ *G11C 11/56* (2013.01); *G06F 3/0604* (2013.01); *G06F 3/0655* (2013.01); *G06F 3/0673* (2013.01); *G11C 7/1051* (2013.01); *G11C 7/1096* (2013.01); *G11C 7/06* (2013.01); *G11C 7/222* (2013.01)

(58) Field of Classification Search
CPC ..... G11C 11/56; G11C 7/1051; G11C 7/1096; G11C 7/06; G06F 3/0604; G06F 3/0655; G06F 3/0673

See application file for complete search history.

(56) References Cited

U.S. PATENT DOCUMENTS

| | | | |
|---|---|---|---|
| 5,398,302 A * | 3/1995 | Thrift ...................... | G06N 3/08 706/25 |
| 2013/0044535 A1* | 2/2013 | Shimakawa ....... | G11C 16/3418 365/148 |
| 2022/0171376 A1* | 6/2022 | Kim ................ | G05B 19/41885 |
| 2022/0309331 A1* | 9/2022 | Jantscher ............... | G06N 3/065 |
| 2023/0087722 A1* | 3/2023 | Ren ....................... | G06N 3/045 706/26 |

\* cited by examiner

*Primary Examiner* — Min Huang
(74) *Attorney, Agent, or Firm* — Jordan IP Law, LLC (57) ABSTRACT

Systems and methods for precision writing of weight values to a memory capable of storing multiple levels in each cell are disclosed. Embodiments include logic to compare an electrical parameter read from a memory cell with a base reference and an interval reference, and stop writing once the electrical parameter is between the base reference and the base plus the interval reference. The interval may be determined using a greater number of levels than the number of stored levels, to prevent possible overlap of read values of the electrical parameter due to memory device variations.

20 Claims, 7 Drawing Sheets

PRECISE WRITING OF MULTI-LEVEL WEIGHTS TO MEMORY DEVICES FOR COMPUTE-IN-MEMORY

TECHNICAL FIELD

Embodiments described herein generally relate to memory devices that support writing of multiple weight levels, and in particular to precision writing of weights to a memory device supporting compute-in-memory.

BACKGROUND

Machine learning may be enabled by a neural network, which is comprised of a plurality of interconnected nodes, which roughly approximate the neuron and synapse structure of a brain. In operation, each node in a neural network may be configured to store a weight, the weight representing strength of the node connection to adjoining nodes. The impact the node has on the overall computation being performed is thus at least partially determined by the node's weight. As the neural network is trained, the weights at each node may be adjusted, thus facilitating the neural network's learning functionality. The weight at each node may be expressed in terms of a series of discrete levels. For example, each node of a given neural network may be capable of storing up to 256 levels (8 bits), or some other multiple of two, that can be expressed via a binary number.

DESCRIPTION OF EMBODIMENTS

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" or "logic" may refer to, be part of, or include an integrated circuit, a System on a Chip (SoC), an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein, the terms "iterative", "iteratively", "repeated" and "repeatedly" mean executing an action at discrete intervals on a regular or ad hoc basis, potentially for an indefinite period of time, and/or until a stop condition is met or the action is otherwise halted. The terms contrast to an action that is executed "continuously", meaning the action is ongoing without interruption until a stop condition is met or the action is otherwise halted.

In computing, memory technologies traditionally have stored binary information, i.e., on/off representing a binary 1 or 0, with each digit being stored in a memory cell or location. Storage of non-binary information thus required digitization into a discrete set of numbers, followed by conversion of the data into binary numbers. Each 1 or 0 of the binary numbers would then be stored into an individual cell. Any number greater than one would thus require multiple cells, with greater numbers of levels requiring a greater number of cells for each such number. Newer memory technologies are able to store multiple levels (beyond on/1 or off/0) in a single cell, such as by storing a voltage or a current at an arbitrary level. A cell in such a memory may be capable of storing any voltage or current level from zero to a maximum amount, the maximum amount determined by the type of technology used to implement the memory. Effectively, such a memory amounts to an analog device that can store a nearly infinite amount of levels. By establishing discrete voltage or current levels, numeric ranges that would otherwise require multiple bits, and so multiple cells, can be stored into a single cell. The number of levels capable of being stored may potentially be dictated by the type of technology used to implement a given memory device. Memory technologies capable of storing a range of voltage or current levels in a given cell (hereinafter, multi-level memories) can include technologies such as resistive random-access memory (e.g., ReRAM, RRAM, or memristors), ferroelectric field-effect transistor (FeFET), gain cell embedded dynamic random access memory (DRAM), phase change memory (PCM), or another suitable technology. Such technologies may be volatile in nature, requiring continuous power to maintain stored values and losing such values when power is removed, or non-volatile in nature, similar to flash storage, maintaining stored values indefinitely without requiring power.

Despite being potentially capable of storing nearly infinite levels of voltages or currents between zero and a maximum device voltage/current, device variations and/or imperfections from manufacturing, environmental changes, etc., place a practical limit on the number of discrete levels that can be stored in a cell of a given multi-level memory. This imprecision manifests as a deviation between an applied voltage or current to be stored in a cell, and the resultant voltage or current that is read from the cell following storage. For example, a voltage may be applied to a cell to store a level of +3 VDC, where the cell can store a level up to +5 VDC. However, due to device variations, the same cell may register below, at, or above the target written voltage of +3 VDC when read, and further may vary from instance to instance when +3 VDC is stored. For example, storing precisely +3 VDC at three separate times to the cell may result in a subsequent read current of +3.06 VDC, +2.89 VDC, and +2.97 VDC, respectively. Consequently, for a given target voltage to be stored, the read voltage may approximate a bell curve distribution centered around the written voltage when each successive write and read cycle is mapped.

The variation or drift in voltages may be due to inherent imprecisions in the materials employed and manufacturing process of the multi-level memory, and so may only be capable of being minimized, but not eliminated. Even precisely controlling manufacturing and materials to minimize drift may have a practical limit of cost: once a certain level of minimal drift is obtained, further reductions in drift may be possible, but cost-prohibitive to manufacture at a commercial scale. Furthermore, the writing circuitry, including the circuitry that generates the voltage level to be written, may itself have a drift or variation, viz. the generator may actually output +2.9 VDC or +3.02 VDC for a nominal output of +3 VDC; this drift or variation in the written voltage level further compounds errors resulting from the variation or drift in read voltages. The actual size of the bell curve distribution of a given stored voltage or current level is essentially the sum of the variance inherent in the multi-level memory device and the variance of the generator of the reference voltage to be stored.

This variation in written versus read voltages or currents imposes a practical limit on the number of different levels that could be stored into a cell, as the standard deviation of the read voltages must be accounted for. If two adjacent written levels are sufficiently close, e.g. one level at +2.8 VDC with the next level at +3 VDC, with a multi-level memory that has a per-cell variation of up to +/−0.15 VDC, the standard deviation of the read voltages may overlap sufficiently that it may not be possible to consistently distinguish between the two adjacent written levels. Storing a voltage level of +2.8 VDC, assuming the voltage generation circuitry precisely outputs +2.8 VDC, could result in a read voltage ranging from +2.65 VDC to +2.95 VDC, while storing +3.0 VDC could result in a read voltage ranging from +2.85 VDC to +3.15 VDC. As can be seen, there is overlap of the potential read voltage distributions between the two levels, between +2.85 VDC and +2.95 VDC. Voltages falling within this range cannot be reliably determined to be either +2.8 VDC or +3.0 VDC.

Supporting circuitry for a multi-level memory typically needs to be capable of generating multiple levels of voltages or currents, with the number of levels corresponding to each level needed for a given implementation. In some implementations, these levels may be generated by a resistor network configured as a voltage divider, as is known in the art. A person skilled in the art will understand that such a network requires a resistor ladder or voltage divider network with a number of taps that correspond to each possible level. For example, where 256 levels of voltage are needed, a voltage divider with 256 taps, each tap corresponding to one of the 256 levels, is needed. As the number of taps needed keeps increasing, so too does the amount of space required by the circuitry to accommodate the number of taps. Furthermore, because such multi-level memories are used with a digital computer, the number of taps is typically defined by a binary number, e.g. 256 levels corresponds to eight bits. Adding a bit, to nine bits, doubles the number of possible levels to 512, and would require a doubling in size of the voltage divider network. Thus, as the number of levels desired to be stored into a multi-level memory increases, the size and number of taps of the supporting voltage divider network will increase exponentially. This acts to put a practical limit to the number of levels that can be stored into a given cell using existing technology.

Disclosed embodiments provide a memory system for storing into individual cells of a multi-level memory one of a number of different levels at a sufficiently high precision to account for and minimize or eliminate any possible overlap between distributions of adjacent voltage levels. Furthermore, disclosed embodiments also provide a voltage or current reference generator that is bit-based, rather than level-based, to allow for significantly better scaling of the number of stored levels for a given cell in the multi-level memory. By employing a bit-based approach, increasing the number of bits of levels, e.g. going from 256 levels to 512 levels (8 bit to 9 bit) only requires adding additional circuitry to accommodate the additional bit, rather than doubling the number of available voltage taps from a voltage divider. Thus, scaling the voltage or current reference generator to greater numbers of levels is linear, rather than exponential.

This bit-based reference generator enables control and writing of voltages to be accomplished to a greater precision, which in turn allows for closer spacing or additional levels to be potentially stored into a given cell of a multi-level memory. By adding an additional bit to the reference generator beyond the number of desired voltage or current levels, the variation of level voltages from the reference generator can be minimized. As the distribution of read voltages or currents is a sum of the variation inherent in the memory as well as the reference generator, essentially halving the variation of the reference generator by adding an additional bit (which doubles the number of possible reference voltage levels) can reduce, if not eliminate, the potential for overlap of read voltage distributions.

The disclosed embodiments may be useful for efficiently storing synaptic weights of an artificial neural network (ANN), such as a deep neural network (DNN), with each weight capable of being directly stored into a single cell of a multi-level memory. Furthermore, such efficient storage can be used for compute-in-memory approaches, where the multi-level memory is part of a machine learning accelerator or similar hardware. The multi-level memory may be equipped with circuitry for evaluating inputs to an ANN, created in the multi-level memory, with single cells being used for nodes of the ANN and/or edges or connections. As each cell can store one of multiple current or voltage levels, the various levels can be used to represent node or edge weight on a per-cell basis, which may be directly read in a single step and used by computing circuitry associated with the multi-level memory in evaluating inputs to the ANN.

While the foregoing primarily discusses various voltage levels, it should be understood that other electrical parameters may be stored, depending upon the technology used to implement the multi-level memory. Other possible parameters may include charge (e.g. capacitance), or resistance, or another parameter that can be repeatably stored and reliably retrieved. For example, memristor-based memory cells, offering a programmable cell resistance, essentially store a current level, which varies when a fixed voltage is applied to read a given cell based upon the stored level. The resistance of a given cell can be adjusted and is set during the write process. As current for a given voltage applied across a component is dependent upon the resistance of the component, the resistance written to the cell thus alters the current output when a fixed read voltage is applied to the cell. This varying current level is sensed and used to determine the stored level or value. Other memory technologies may employ variable capacitance for each cell, effectively allowing each cell to store a variable voltage.

Figure 1:
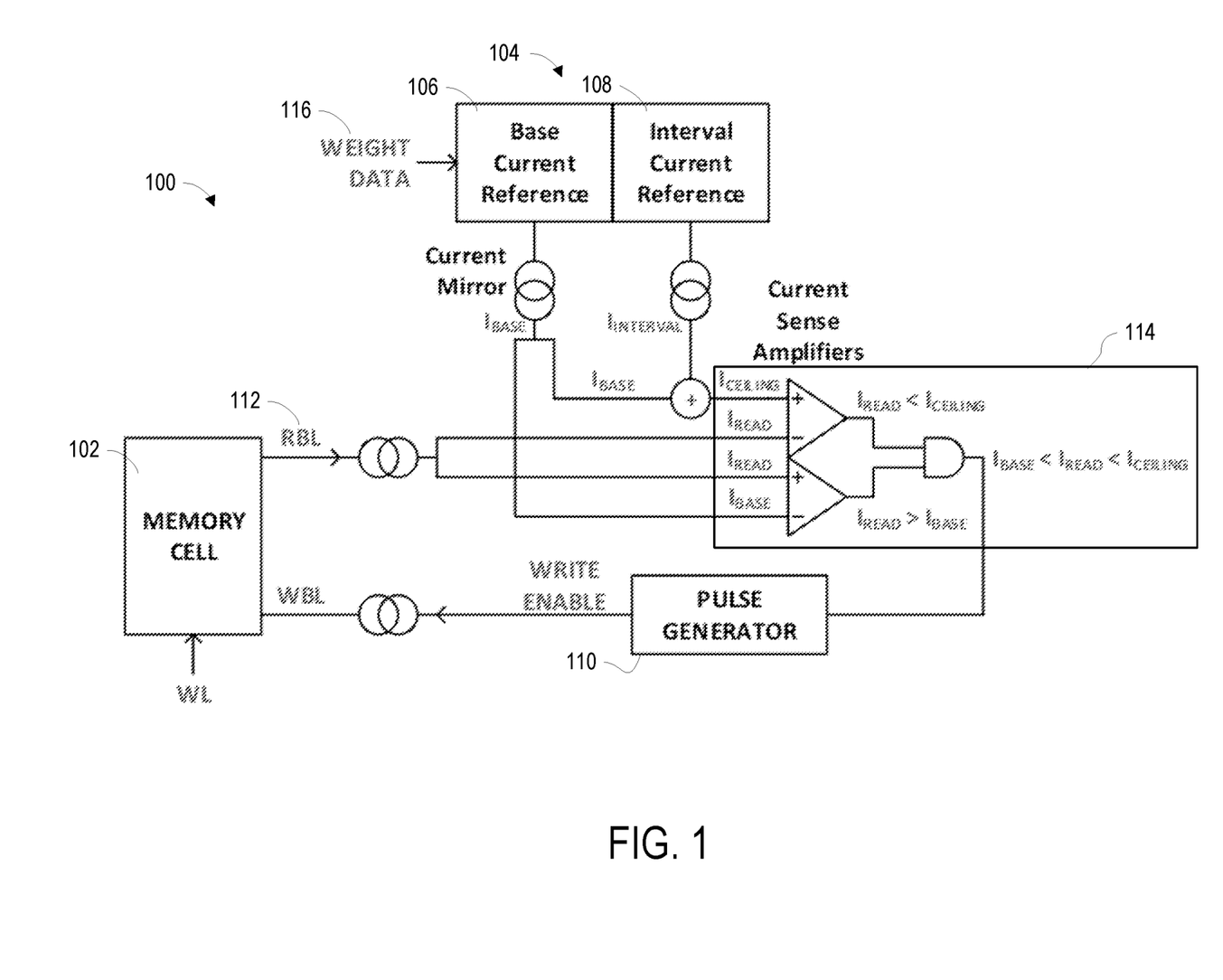
FIG. 1 is a block diagram of the components of an example system for precise writing of synaptic weights to a memory device capable of storing multiple levels of weights, according to various embodiments.

FIG. 1 depicts an example system 100 for precision writing of a level into a memory unit capable of storing variable levels or analog weights into each of its cells, according to a possible embodiment. System 100 includes cell 102 that is part of a multi-level memory, a current reference generator 104, a pulse generator 110, and write logic 114. In operation, the current reference generator 104 determines a base current and an interval current based upon weight data 116. The base and interval currents are compared by write logic 114 with a current read from the memory cell 102, on read bit line 112. If the evaluation by write logic 114 determines that the memory cell 102 does not yet store the intended weight data 116 (as expressed by a current or voltage level), it continues the write process until the write logic 114 determines that the correct current level has been obtained, as verified by the read bit line 112. While system 100 depicts a single memory cell 102, it should be understood that system 100 may be employed for a multi-level memory that is comprised of a plurality of cells to form a memory unit. Furthermore, depending upon the specifics of a given embodiment, the various components of system 100 may be duplicated or used for multiple iterations. For example, while a given memory unit may have numerous memory cells 102, it may have a single or a few current reference generators 104, where one generator 104 may be employed with any number of memory cells 102. Likewise a single or a few instances of write logic 114 and pulse generator 110 may be employed with multiple memory cells 102.

Memory cell 102 may be one of a plurality of memory cells 102 that, in combination form a multi-level memory. Each memory cell 102, in embodiments, is capable of storing currents in a predefined range on an essentially continuous, e.g. analog, basis. The predefined range may be for current levels, with a base or floor of no current, and a maximum current of 100 milliamps, or another value depending upon the specifics of a given implementation. Alternatively, the predefined range may be for voltage levels, ranging from a zero voltage to a maximum voltage that may be defined by a system power supply, e.g. +12 VDC, +9 VDC, +5 VDC, +3.3 VDC, +1.2 VDC, or another power level. Within this predefined range, discrete steps or levels may be defined, with the interval between steps (such as varying current levels) determined based at least partially upon device characteristics such as variations in read currents following writing. Memory cell 102, as part of a multi-level memory, may be implemented using any suitable technology, as mentioned above. Such technologies may include ReRAM, RRAM, PCM, FeFET, or another suitable technology now known or later developed. Memory cell 102 may be implemented using either volatile, i.e. contents are lost when power is removed, or non-volatile, i.e. contents persist when power is removed, memory technologies.

Current reference generator 104, in embodiments, includes circuitry for generating a base current reference 106, resulting in a signal $I_{BASE}$, and an interval current reference 108, resulting in a signal $I_{INTERVAL}$. The interval current reference 108 is determined relative to the base current reference 106. In embodiments, the interval current reference 108 may be expressed as a delta to be added to the base current reference 106, where the actual amount of the interval current reference 108 may be less than the actual amount of the base current reference 106, depending upon the actual amount of the base current reference 106. For example, where base current reference 106 is +2.9 VDC, the interval current reference 108 may be +0.5 VDC. For another example, where base current reference 106 is +0.2 VDC, the interval current reference 108 may still be +0.5 VDC. In embodiments, the base current reference 106 defines the lower bound for a particular level or weight to be stored into memory cell 102, with the interval current reference 108 defining the width (in terms of current) of the level or weight to be stored into memory cell 102. To express in absolute terms, adding the interval current reference 108 to the base current reference 106 yields a ceiling current, $I_{CEILING}$, with the base current reference 106 and $I_{CEILING}$ defining the lower and upper bounds, respectively, of a given level or weight to store into memory cell 102.

Current reference generator 104 receives as input a weight data 116, which determines the weight or level to be stored into the target memory cell 102. The weight data 116 may be received from external circuitry to system 100, such as a memory controller, processor, or other components. Weight data 116, in embodiments, represents the weight to be assigned or adjusted for a node or edge of an artificial neural network, expressed as a numerical level of a plurality of possible levels that can be stored into a memory cell 102. The weight data 116 may be a numerical value, possibly expressed in binary, which current reference generator 104 converts into the base current reference 106 and corresponding interval current reference 108. These reference currents are used during the writing process to determine when a current level corresponding to the weight data 116 has been successfully stored into the target memory cell 102. The structure of a possible embodiment of current reference generator 104 is discussed below with respect to FIG. 3. The process of using the reference currents in the writing process, and the relationship of the base current reference 106 to the interval current reference 108, is discussed below with respect to FIG. 5.

System 100 may also include a pulse generator 110. Pulse generator 110, in embodiments, generates a voltage pulse which is applied to memory cell 102. Application of the voltage pulse to memory cell 102 causes memory cell 102, in embodiments, to increase its stored current level. Repeated pulses from pulse generator 110 may incrementally cause memory cell 102 to step up its stored current level with each pulse, until a maximum current is stored, the maximum current depending upon the operating specifications of memory cell 102. In other embodiments, rather than a pulse generator to ramp up the stored current level of the memory cell 102, another suitable mechanism may be used, depending upon the specifics of a given implementation of memory cell 102. In still other embodiments, memory cell 102 may store levels using a descending approach to current or voltage, viz. the voltage or current is highest at a base, or zero weight, and drops as the weight increases. In such embodiments, the highest or greatest weight (numerically, largest) would equate to the lowest stored voltage or current.

In some embodiments, pulse generator 110 may create a pulse once each clock cycle while enabled. In other embodiments, pulse generator 110 may be triggered on an ad hoc basis. In still other embodiments, pulse generator 110 may be omitted or may be configured to emit a pulse, voltage, or current as necessary to cause memory cell 102 to write the correct weight corresponding to weight data 116. The implementation of pulse generator 110 may depend upon the nature of memory cell 102. As discussed above, a given system 100 may have a single pulse generator 110 or a few pulse generators 110 corresponding to the maximum amount of data that can be written, with the pulse generators 110 each servicing any number of memory cells 102.

Write logic 114, as suggested by the schematic components in FIG. 1, receives as input current signals from current reference generator 104, according to some embodiments. The various inputs, as depicted in FIG. 1, may include $I_{BASE}$, $I_{INTERVAL}$, and $I_{READ}$. In the depicted embodiment, write logic 114 receives the base current reference 106, $I_{BASE}$, and $I_{CEILING}$, which is computed by adding base current reference 106 to interval current reference 108. These references are compared to a current signal from the read bit line (RBL) 112, $I_{READ}$, which reflects the voltage or current level currently stored in the memory cell 102. The output of the write logic 114, in the depicted embodiment, is in turn fed to pulse generator 110 for ramping up the stored level in the memory cell 102. As the current stored level is fed back to write logic 114 via read bit line 112, the combination of write logic 114, pulse generator 110, memory cell 102, and read bit line 112 form a feedback loop that enables precision control of the levels written into memory cell 102. Write logic 114, in the depicted embodiment, is comprised of two current sense amplifiers, and an AND logic gate. The actual components of write logic 114 may vary depending upon the requirements of a given implementation. The process of writing as implemented by write logic 114 is discussed further below with reference to FIG. 5.

In the depicted embodiment, a current sense amplifier compares a ceiling current reference, created by adding the interval current reference 108 to the base current reference 106, with the current from the read bit line 112. If the current from the read bit line 112 is less than the ceiling current reference, the current sense amplifier outputs a logical high or "1", otherwise it outputs a logical low or "0". Similarly, a second current sense amplifier compares the current from the read bit line 112 with just the base current reference 106. If the current from the read bit line 112 is less than the base current reference 106, the current sense amplifier outputs a logical high or "1", otherwise it outputs a logical low or "0". The outputs from the two current sense amplifiers feed into a logical AND gate, which in turn is tied to the pulse generator 110. As will be understood, both current sense amplifiers must output a logical high for the AND gate to output a logical high, which in turn keeps the pulse generator 110 active and stepping up the stored current level of memory cell 102. Once the current from the read bit line 112 exceeds the base current reference 106, the current sense amp outputs a logical low, turning the AND gate to a logical low, and shutting down the pulse generator 110. Other embodiments may use different logic gates and/or ways to measure and compare the relevant current levels, depending upon the requirements of a given embodiment.

Figure 2:
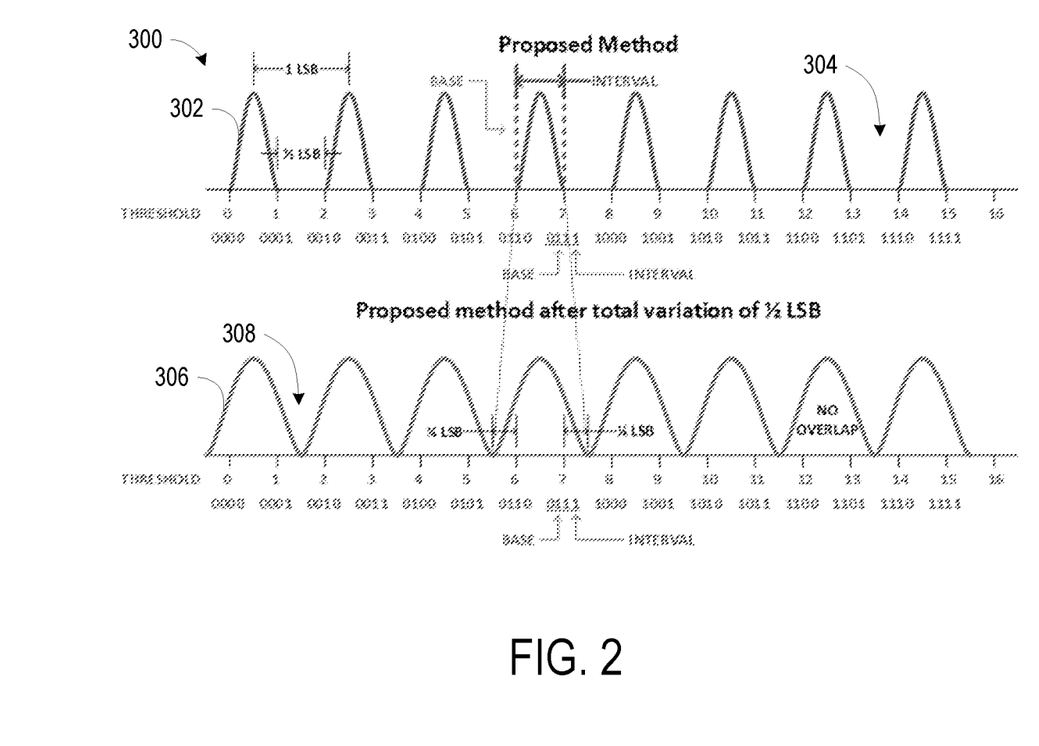
FIG. 2 is a graph showing the distribution of current levels corresponding to weights, written to a memory device according to the disclosed embodiments, and the resultant distribution of read currents for each weight.

FIG. 2 illustrates a distribution chart 300 resulting from the disclosed embodiments. Any given number of levels that can be stored into memory cell 102 may be expressed in binary, such as three bits for eight possible levels. Each bit level of the example, from 0 to 7 for three bits, is defined as a discrete current level to be read from a multi-level memory cell. The current or voltage for each level can be represented as a bell curve distribution associated with each level. The peak of each distribution is the target or nominal current or voltage for its associated level, while each distribution curve represents the statistical likelihood that a conventional reference generator would output a reference current or voltage at that point. For a given memory technology, each distribution may be approximately contiguous with its neighbors, with little to no overlap of distributions. This arrangement is shown by distributions 306 in the memory cell 102. For a given memory cell 102, the distribution curves may be the result of inherent variances and inconsistencies of the components of the multi-level memory. Where the distribution curves of levels stored in the memory cell 102 are contiguous and only due to variances in the memory cell 102, the distribution curves represent a practical maximum number of possible levels that can be stored in the memory cell 102.

The current reference generator, such as current reference generator 104, itself may have variances and/or inconsistencies that result in the generated reference currents each having their own distribution curve. When written to a memory cell 102, the distribution curve of the current reference generator 104 adds to the distribution curves of the memory cell 102. Consequently, the resulting distribution curves from the memory cell 102 are more spread out and bell-shaped than than they would be if a precisely controlled voltage or current, with virtually no distribution, was used to write into the memory cell 102. This greater spread is the result of the combination of variances and inconsistencies in the conventional reference generator added to the inherent variances and inconsistencies of the memory cell.

When the levels to be stored are selected to yield contiguous distribution curves for each level that can be stored to a memory cell 102, this greater spread results in overlapping regions between the otherwise contiguous distribution curves. The overlapping regions thus represent areas where a precise level cannot be ascertained from the memory cell, as the result is ambiguous. In conventional systems, either the levels must be selected so that the resultant distribution curves account for the possible distribution curves of the reference currents, potentially reducing the number of possible levels, and/or the memory cell must be tested following writing to determine if the written value falls into the overlap region. If so, the cell would need to be re-written to avoid the presence of ambiguous data that could detrimentally affect the performance of the multi-level memory. This testing and potential re-write consumes computing resources and so imposes a potential performance hit upon the multi-level memory and associated management system.

Embodiments address this problem by increasing the precision of the current reference generator, essentially by increasing the number of levels the current reference generator can create. Rather than three bits to define each level, an additional least-significant bit (LSB) is added to the level definitions, allowing for sixteen (four bits) discrete levels. However, for each level, the LSB is ignored for purposes of defining levels, so that only every other level region is utilized. This effectively results in eight discrete levels, defined when the LSB is a "0", that are each separated by dead bands 304, with each dead band 304 defined by a "1" in the LSB. The reference generator circuitry, it should be understood, is configured with sufficient precision in its components so that it could output a distribution 302 that would be contiguous for sixteen levels. Each discrete level thus has a distribution 302 that abuts a dead band 304 on either side, rather than being contiguous with the distributions of its adjacent levels.

The addition of an extra LSB results in the increased precision of the reference generator by a factor of two, in the example depicted distribution chart 300. When each of the levels corresponding to distributions 302 are written to a memory cell, the resulting addition of the memory cell's variances with the more precise control of the reference generator results in distributions 306 in the memory cell, which only minimally overlap, or do not overlap. As can be seen, each of the resulting eight distributions 306, each corresponding to one of eight intended levels, abuts but does not overlap its contiguous neighbors. As a result, each level is accurately and unambiguously stored without the need for a verification and potential rewrite process.

Figure 3:
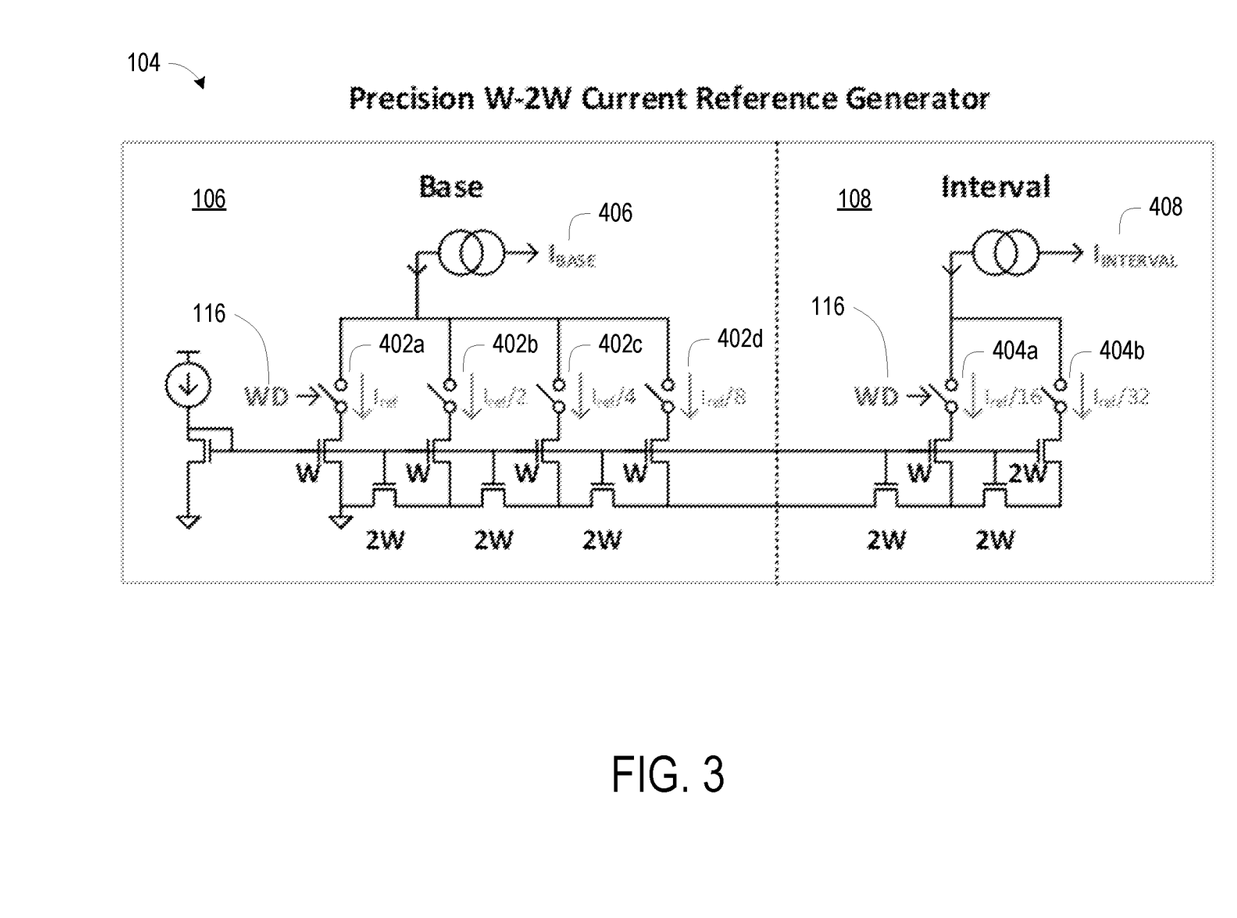
FIG. 3 is a block diagram of the components of precision current reference generator that may be usable with the example system of FIG. 1, according to various embodiments.

FIG. 3 illustrates the components of an example implementation of the current reference generator 104 of FIG. 1, according to various embodiments. Current reference generator 114 includes a base current reference 106 portion and an interval current reference 108 portion. Both base current reference 106 and interval current reference 108 accept as input weight data 116, which feeds into a series of switches 402a, 402b, 402c, 402d, for base current reference 106, and switches 404a, and 404b, for interval current reference 108. In the depicted embodiment, current reference generator utilizes the switches 402a-402d and 404a-404b to represent the bits that correspond to the binary expression of the number of levels, plus one or more additional LSBs to achieve the necessary write precision to prevent overlapping regions in the memory cell. The base current reference 106 outputs a base current reference signal 406, and the interval current reference 108 outputs an interval current reference signal 408. The base current reference signal 406 and interval current reference signal 408 each feed into write logic 114 for driving the pulse generator 110.

In the example of FIG. 3, as can be seen, the base current reference 106 is represented by four most-significant bits, and the interval current reference 108 is represented by two least-significant bits. Current reference generator 104 is essentially a current divider network implemented using a combination of switches and transistors. In operation, the weight data 116 may be binary, with its most significant data being used to actuate switches 402a-402d. Where the most significant data has a "1", the switch would be toggled on, while a "0" would result in the switch toggling off. For example, where the weight data 116 is level 11, the resulting binary number would be expressed as 01011, ordered most significant to least significant bit. With such a number, switch 402a would be open, corresponding to the first "0", switch 402b would be closed, corresponding to the second "1", switch 402c would be open, corresponding to the third "0", and switch 402d would be closed, corresponding to the fourth "1". The LSBs actuate the switches 404a and 404b of the interval current reference 108. Keeping with the above example level 11, switch 404a would be closed, corresponding to the fifth "1".

As explained above with reference to FIG. 1, the base current reference 106 forms the lower bound for each current level, while the interval current reference 108, which is added to the base current level, forms the upper bound for each current level. The number of bits of the interval current reference 108 dictates the precision of the reference current generated by the current reference generator 104. The greater the number of LSBs in the interval current reference 108, the more precisely the current levels can be controlled, and the wider the potential deadbands between each current level can be made. In the example in FIG. 3, the current reference generator 104 is capable of a base reference current plus three additional segments. A given number input into base current reference 106 provides the base current reference when the interval current reference 108 is "00", both switches 404a and 404b being off. Intervals above the base current reference 106 are then defined at "01" (switch 404a being off and 404b being on), "10" (switch 404a being on and 404b being off), and "11" (both switches 404a and 404b being on). The actuation of the LSB switches in interval current reference 108 can be selected to maximize the precision of the levels written into a memory cell. In some embodiments, only one LSB switch may be necessary, such as to generate the distributions in distribution chart 300 (see FIG. 2). In other embodiments, more than two LSB switches may be provided to provide a greater granularity and wider deadbands between levels. Additional bits may be used where current reference generator 104 is used with a multi-level memory that is subject to a relatively wide inherent variance, and so greater precision is needed from current reference generator 104 to ensure no overlapping regions in values stored in the memory. This approach contrasts with conventional solutions, where no deadband is provided between the regions that comprise each level, as discussed above with respect to FIG. 2.

Figure 4:
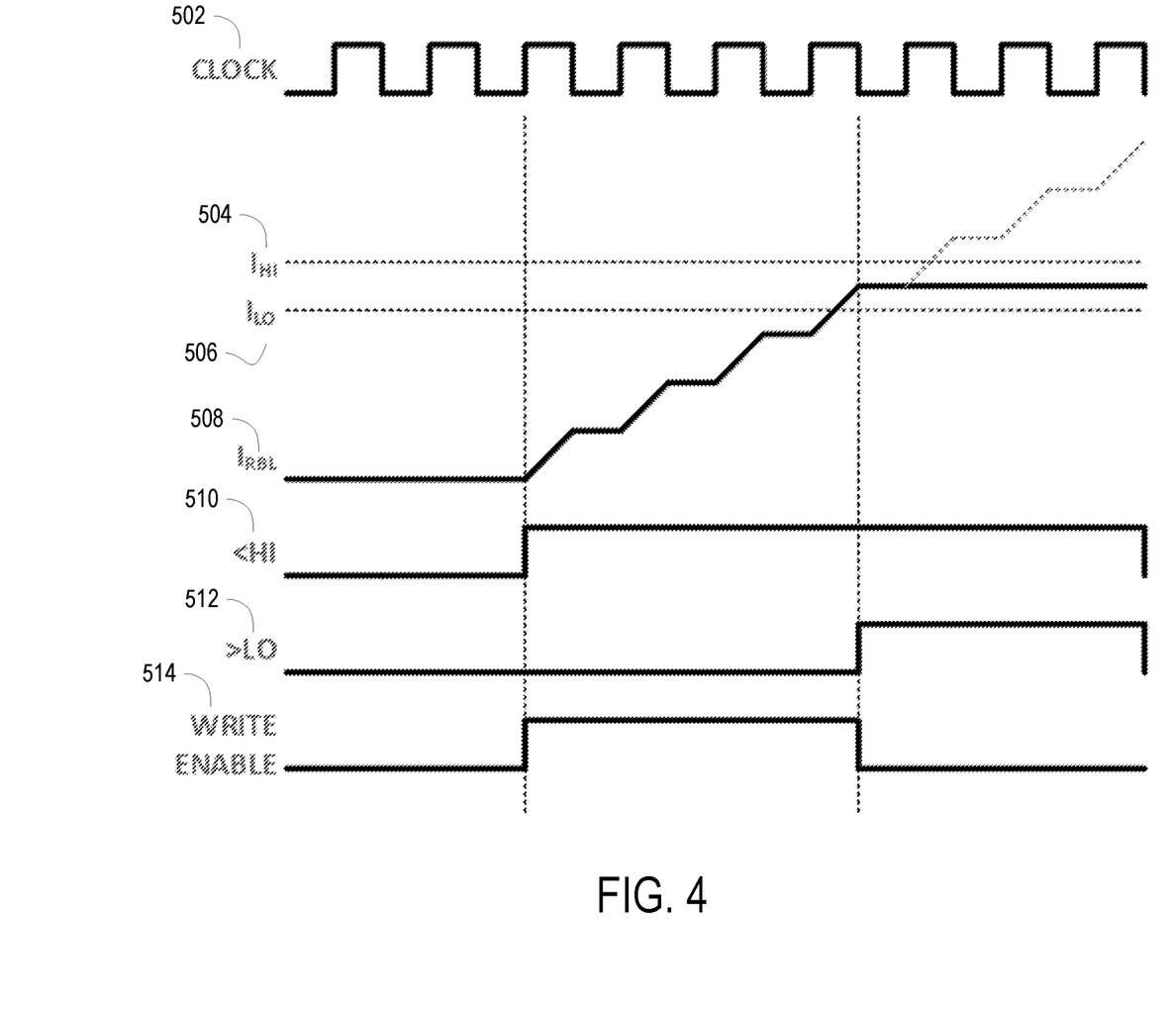
FIG. 4 is a chart of the signals over time of various signal lines relevant to writing synaptic weights, such as may be found in the example system of FIG. 1, according to various embodiments.

In FIG. 4, the signals of the various lines of example system 100 are depicted over time, to help illustrate the writing process. Signal lines in FIG. 4 include a clock 502, which strobes at fixed intervals, a ceiling current 504, base current 506, read bit line current 508, current below ceiling 510, current above base 512, and a write enable 514. Clock 502, in the depicted chart, transitions between high and low at set intervals, with the distance between transitions relatively consistent. The clock 502, as will be understood, controls the timing for the various actions of system 100. Base current 506 is tied to and provides the base current reference signal 406 (FIG. 3). Ceiling current 504 is tied to and is the sum of the base current reference signal 406 and the interval current reference signal 408 (FIG. 3). The addition of the interval current reference to the base current reference yields the ceiling current reference. The base current reference and the ceiling current reference thus define lower and upper bounds, respectively, of the current band that comprises a given level or weight to be stored into a memory cell.

Initially, the read bit line current 508, which is the wave form for the read bit line 112, the current below ceiling 510, the current above base 512, and the write enable 514 lines are low prior to the start of the writing process. Once writing is initiated (the first vertical line), the write enable 514 goes high along with the current below ceiling 510. When the current below ceiling 510 line is high, it indicates that the read bit line current 508 is outputting a current that is below the ceiling current 506. Similarly, the current above base 512 line is held low, as the read bit line current 508 is also below the base current 506. As long as the write enable 514 line is high, a pulse generator 110 or similar apparatus connected to the associated memory cell will increase the stored current of the memory cell. In the depicted waveform, the current of the memory cell increases in a stepwise fashion tied to the clock 502, which controls when a pulse generator, such as pulse generator 110. On each clock transition from low to high, in the depicted waveform, the pulse generator 110 issues a pulse which steps up the stored current level in the memory cell.

The stepwise increasing of stored current level continues until the read bit line current 508 indicates a current that exceeds the base current 506 amount, but has not exceeded the ceiling current 504. At this point, the current above base 512 line transitions to high, while the current below ceiling 510 line remains high. With both lines 510 and 512 high, the write enable 514 line is pulled low, ending the write process. As can be seen, the read bit line current 508 is located between the base current 506 and the ceiling current 504, indicating that the memory cell has been programmed to the desired current level.

Figure 5:
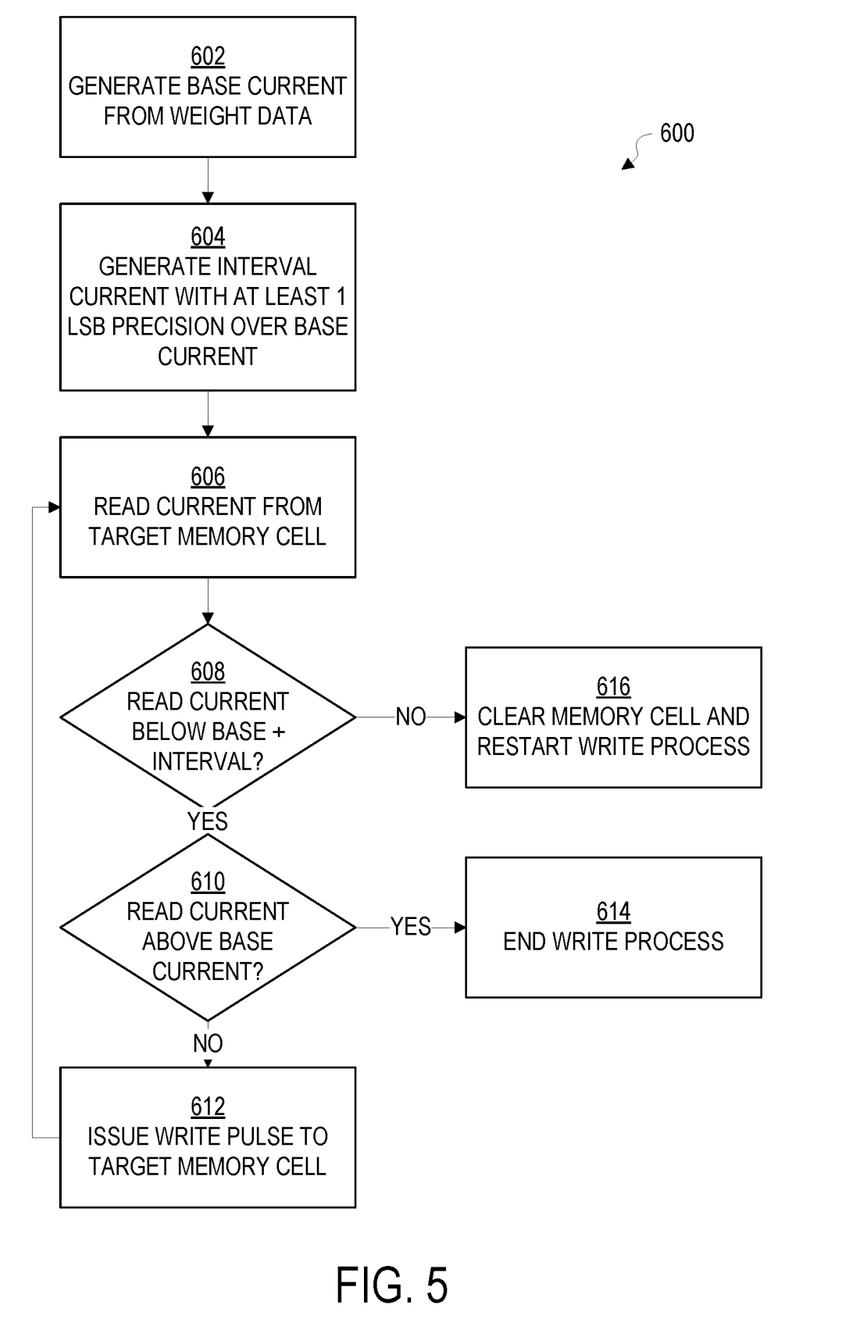
FIG. 5 is a flowchart of the various operations of a method for writing synaptic weights to a memory device, such as may be executed by the example system of FIG. 1, according to various embodiments.

FIG. 5 depicts the operations of a method 600 for precision writing of weight values to a memory cell capable of storing multiple current levels. Method 600 may be executed by a system such as system 100 on a memory cell, such as memory cell 102. Method 600 may be executed at least in part by compute logic, such as a memory controller or write logic 114, embedded on a multi-level memory, such as may be configured for a compute-in-memory process. The operations of method 600 may be performed in whole or in part. Some operations may be omitted in some embodiments, while other embodiments may add additional operations.

In operation 602, a base current reference is generated from weight data, the weight data indicating a level or weight to be stored into a memory cell. The base current reference may be generated by a current reference generator, such as current reference generator 104. The weight data may be expressed in a binary format, with the most significant digits of the weight data being used by the current reference generator to establish the base current reference.

In operation 604, an interval current reference is generated by the current reference generator. The interval current reference is generated from the least significant digits of the weight data. In some embodiments, the interval current reference may add one or more additional least significant digits beyond the digits of the weight data, to provide for dead bands between current levels, to eliminate or minimize any overlap between stored current level distributions in the memory cell.

In operation 606, the writing process commences, and a current value is read from the target memory cell. Once read, in operation 608, the read current is evaluated, such as by a memory controller or write logic, such as write logic 114, for whether it is below the ceiling current, defined as the base current reference summed with the interval current reference.

If the result of the evaluation of operation 608 is "yes", method 600 proceeds to operation 610, where the read current is evaluated by the memory controller or write logic for whether it is above the base current reference. If the result of the evaluation is "no", method 600 proceeds to operation 612. In operation 612, a write pulse is issued to the memory cell to increase its stored current level, and the process iterates back to operation 606. The operations 606 to 612, in embodiments, may iterate at a fixed interval set by a system clock.

If operation 608 evaluates to "no", meaning that the current level stored in the memory cell is above the ceiling current, an error condition is indicated, as the written current level has exceeded the bounds of the desired current level indicated by the weight data. Method 600 then proceeds to operation 616, where the memory cell may be cleared, and the write process recommenced. Depending upon the needs of a given implementation, other operations may additionally or alternatively be executed, e.g. running a diagnostic on the memory cell and/or system or memory management circuitry to determine the cause of the overshoot, recalibrating the LSB digits used to compute the interval to achieve a greater precision or to shift the location of the deadbands between write current distributions, indicating an error condition, and/or other steps appropriate to a given implementation.

If operation 610 evaluates to "yes", meaning that the read current has exceeded the base current reference but is below the ceiling current reference, method 600 proceeds to operation 614 where the write process terminates. The result of operation 614 is a current level that is successfully written to the memory cell.

Figure 6:
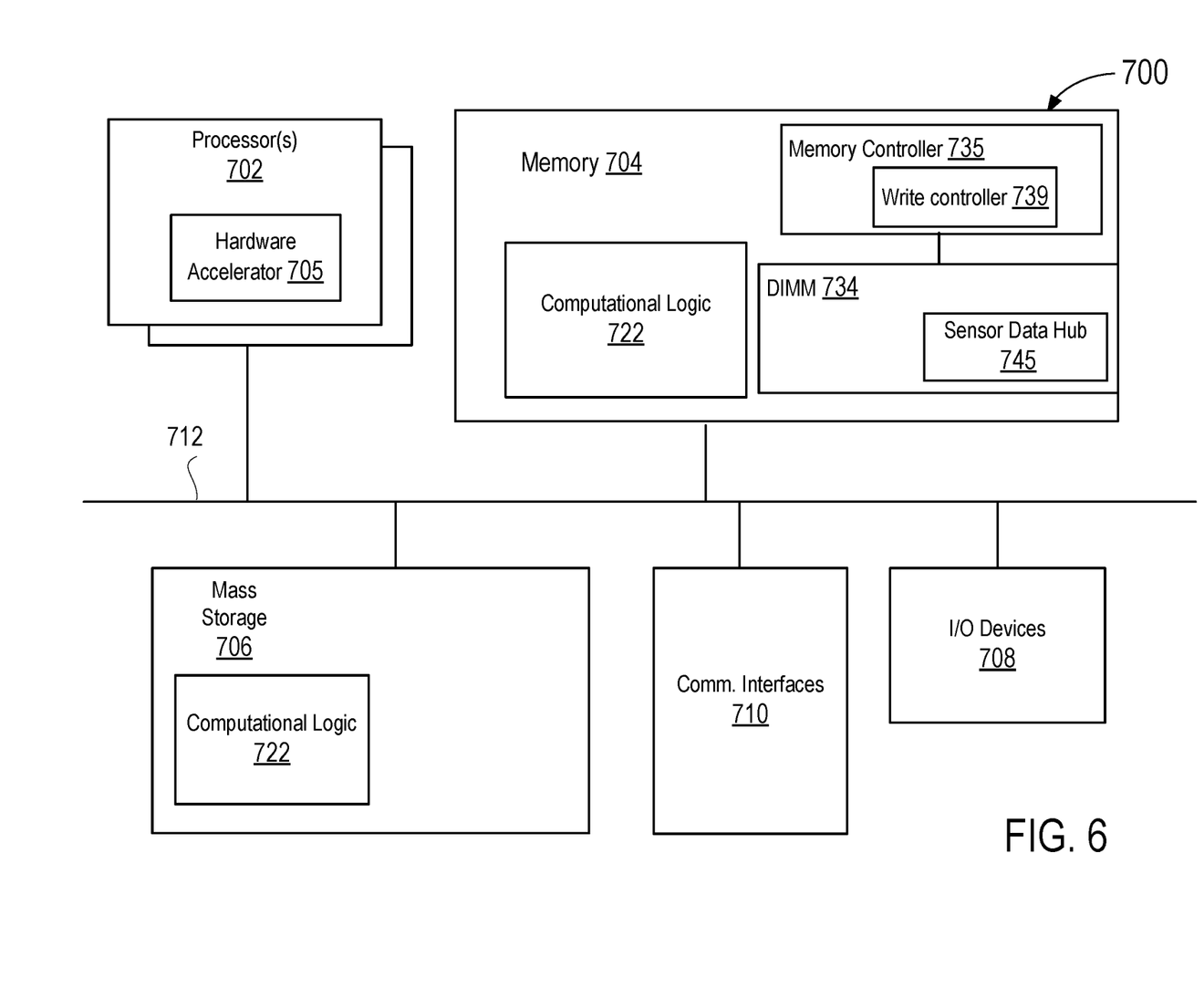
FIG. 6 is a block diagram of a computer device suitable for practicing the present disclosure, according to various embodiments.

Referring now to FIG. 6 wherein a block diagram of a computer device suitable for practicing the present disclosure, in accordance with various embodiments, is illustrated. As shown, computer device 700 may include one or more processors 702, memory controller 735, and memory 704. Each processor 702 may include one or more processor cores, and hardware accelerator 705. An example of hardware accelerator 705 may include, but is not limited to, programmed field programmable gate arrays (FPGA). In embodiments, processor 702 may also include a memory controller (not shown). In embodiments, memory 704 may include any known volatile or non-volatile memory, including, for example, DIMM 734, which may include sensor data hub 745. DIMM 734 may be controlled by memory controller 735. Alternatively, memory controller 735 may be provided in processor 702 (not shown). In embodiments, memory controller 735 may include write controller 739. Write controller 739 may implement some or all of write logic 114 or its equivalent functionality, as described above with reference to FIGS. 1-5.

Additionally, computer device 700 may include mass storage device(s) 706 (such as SSDs 709), input/output device interface 708 (to interface with various input/output devices, such as, mouse, cursor control, display device (including touch sensitive screen), and so forth) and communication interfaces 710 (such as network interface cards, modems and so forth). In embodiments, communication interfaces 710 may support wired or wireless communication, including near field communication. The elements may be coupled to each other via system bus 712, which may represent one or more buses. In the case of multiple buses, they may be bridged by one or more bus bridges (not shown).

System memory 704 and mass storage device(s) 706 may be employed to store a working copy and a permanent copy of the executable code of the programming instructions of an operating system, one or more applications, and/or various components of FIG. 1, FIG. 4, and/or the operations of method 600 in FIG. 5, implemented at least in part via software, collectively referred to as computational logic 722.

The programming instructions implementing computational logic 722 may comprise assembler instructions supported by processor(s) 702 or high-level languages, such as, for example, C, that can be compiled into such instructions. In embodiments, some of computing logic may be implemented in hardware accelerator 705. In embodiments, part of computational logic 722, e.g., a portion of the computational logic 722 associated with the runtime environment of the compiler may be implemented in hardware accelerator 705.

The permanent copy of the executable code of the programming instructions or the bit streams for configuring hardware accelerator 705 may be placed into permanent mass storage device(s) 706 and/or hardware accelerator 705 in the factory, or in the field, through, for example, a distribution medium (not shown), such as a compact disc (CD), or through communication interface 710 (from a distribution server (not shown)). While for ease of understanding, the compiler and the hardware accelerator that executes the generated code that incorporate the predicate computation teaching of the present disclosure to increase the pipelining and/or parallel execution of nested loops are shown as being located on the same computing device, in alternate embodiments, the compiler and the hardware accelerator may be located on different computing devices.

The number, capability and/or capacity of these elements 710-712 may vary, depending on the intended use of example computer device 700, e.g., whether example computer device 700 is a smartphone, tablet, ultrabook, a laptop, a server, a set-top box, a game console, a camera, and so forth. The constitutions of these elements 710-712 are otherwise known, and accordingly will not be further described.

Figure 7:
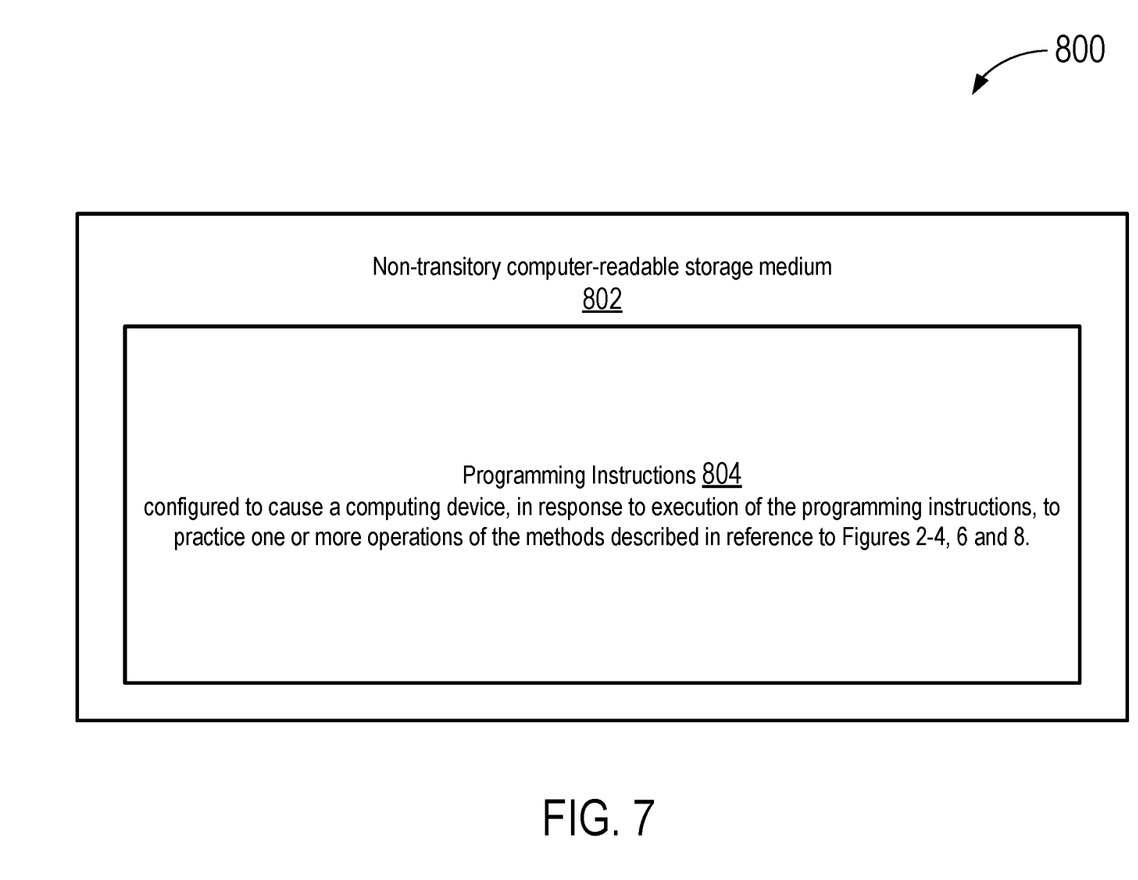
FIG. 7 is an example computer-readable storage medium having instructions configured to practice aspects of the various disclosed embodiments.

FIG. 7 illustrates an example computer-readable storage medium having instructions configured to implement all (or portion of) software implementations of various elements of system 100 and/or method 600, earlier described, in accordance with various embodiments. As illustrated, computer-readable storage medium 802 may include the executable code of a number of programming instructions or bit streams 804. Executable code of programming instructions (or bit streams) 804 may be configured to enable a device, e.g., computer device 700, in response to execution of the executable code/programming instructions (or operation of an encoded hardware accelerator), to perform (aspects of) processes performed by system 100 and/or one or more operations of method 600. In alternate embodiments, executable code/programming instructions/bit streams 804 may be disposed on multiple non-transitory computer-readable storage medium 802 instead. In embodiments, computer-readable storage medium 802 may be non-transitory. In still other embodiments, executable code/programming instructions 804 may be encoded in transitory computer readable medium, such as signals.

Referring back to FIG. 6, for one embodiment, at least one of processors 702 may be packaged together with a computer-readable storage medium having some or all of computing logic 722 (in lieu of storing in system memory 704 and/or mass storage device 706) configured to practice all or selected ones of the operations earlier described with reference to FIG. 5. For one embodiment, at least one of processors 702 may be packaged together with a computer-readable storage medium having some or all of computing logic 722 to form a System in Package (SiP). For one embodiment, at least one of processors 702 may be integrated on the same die with a computer-readable storage medium having some or all of computing logic 722. For one embodiment, at least one of processors 702 may be packaged together with a computer-readable storage medium having some or all of computing logic 722 to form a System on Chip (SoC). For at least one embodiment, the SoC may be utilized in, e.g., but not limited to, a hybrid computing tablet/laptop.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

Illustrative examples of the technologies disclosed herein are provided below. An embodiment of the technologies may include any one or more, and any combination of, the examples described below.

EXAMPLES

The following examples pertain to further embodiments.

Example 1 is an apparatus for precision writing of weights, such as synaptic weights, into a non-volatile memory, comprising a non-volatile memory to store read current that indicates synaptic weight data for an artificial neural network (ANN), and logic coupled with the memory, wherein the logic is to convert the synaptic weight data when input into the logic to generate a base current and an interval current, wherein the base current provides a lower bound current level for the read current, and a combination of the base and interval currents provides an upper bound level for the read current, and wherein the read current indicates the synaptic weight data, and repeatedly write into the memory, to generate an incremental change in a response current of the memory, until a response current is provided between the lower and upper bound levels, wherein the response current comprises the read current that indicates the weight data.

Example 2 includes the subject matter of Example 1, and optionally includes wherein the synaptic weight data correlates to one of a plurality of binary numbers defined by a fixed number of bits.

Example 3 includes the subject matter of any one of Examples 1-2, and optionally includes wherein the logic comprises a current reference generator to generate the base current and interval current.

Example 4 includes the subject matter of any one of Examples 1-3, and optionally includes wherein the current reference generator comprises a switched transistor ladder configured to generate a plurality of base current levels, each corresponding to one of the plurality of binary numbers, and wherein the interval current is generated from a selected one of the plurality of base current levels and an additional bit to generate additional current levels between each of the plurality of base current levels.

Example 5 includes the subject matter of any one of Examples 1-4, and optionally includes wherein the fixed number of bits plus the additional bit are selected to minimize current distribution overlap between the discrete current levels.

Example 6 includes the subject matter of any one of Examples 1-5, and optionally includes wherein the non-volatile memory is one of a resistive random access memory, ferro-electric field effect transistor (FET) memory, indium gallium zinc oxide FET memory, or phase change memory.

Example 7 includes the subject matter of any one of Examples 1-6, and optionally includes wherein the logic comprises a memory controller to iteratively write and iteratively read in synchronization with a clock.

Example 8 includes the subject matter of any one of Examples 1-7, and optionally includes wherein the memory controller further comprises a pulse generator to create the current pulse.

Example 9 includes the subject matter of any one of Examples 1-8, and optionally includes wherein the apparatus comprises a memory device adapted to implement compute-in-memory.

Example 10 is a method for precision writing of weights, such as synaptic weights, into a memory cell, comprising generating a base current to provide to a non-volatile memory capable of storing a plurality of discrete current levels, wherein the discrete current levels correspond to synaptic weights to be provided to an artificial neural network (ANN), generating an interval current above the base current, based at least in part on the generated base current, calculating a ceiling current that is the sum of the base current and interval current, reading a current from a memory cell of a non-volatile memory, writing repeatedly, while the current from the memory cell is less than the ceiling current, a voltage to the memory cell that induces the current read from the memory cell to incrementally increase, and stopping the writing when the current from the memory cell exceeds the base current, wherein the base current is generated based upon a selected discrete current level, from the plurality of discrete current levels, that corresponds to a provided synaptic weight.

Example 11 includes the subject matter of Example 10, and optionally includes wherein each of the plurality of discrete current levels correspond to one of a plurality of discrete levels expressed by a number of bits, and wherein the interval current is determined at a level expressed by the number of bits plus one or more additional bits.

Example 12 includes the subject matter of either of Examples 10 or 11, and optionally includes wherein a number of the one or more additional bits are selected to minimize overlap between read current distributions.

Example 13 includes the subject matter of any one of Examples 10-12, and optionally includes generating a clock signal, and wherein the voltage is written to the non-volatile memory in synchronization with the clock signal.

Example 14 includes the subject matter of any one of Examples 10-13, and optionally includes wherein generating the base current comprises selecting, from a transistor-based current reference generator, a base current corresponding to a threshold between a selected discrete current level from the plurality of discrete current levels, and a discrete current level that is immediately below the selected discrete current level.

Example 15 includes the subject matter of any one of Examples 10-14, and optionally includes wherein the interval current is a predetermined amount equal to half a current differential between the selected discrete current level and a next discrete current level, from the plurality of discrete current levels, that is above the selected discrete current level.

Example 16 is a computing device, comprising a processor, a multi-level memory coupled to the processor, the memory adapted to store a level of a plurality of levels of an electrical parameter that indicates a synaptic weight for an artificial neural network, and memory controller logic coupled to the processor and the memory, wherein the memory controller logic is configured to generate a base reference of the electrical parameter, generate a ceiling reference of the electrical parameter that is a predetermined interval above the base reference, read a stored electrical parameter from the multi-level memory, write repeatedly, while the stored electrical parameter from the memory is less than the ceiling reference, an electrical signal to the memory that causes the stored electrical parameter in the memory to incrementally increase, and discontinue the write when the stored electrical parameter is greater than the base reference.

Example 17 includes the subject matter of Example 16, and optionally includes wherein each of the plurality of levels correspond to one of a plurality of discrete levels expressed by a number of bits, and wherein the predetermined interval is determined as a level expressed by the number of bits plus one or more additional bits.

Example 18 includes the subject matter of either of Examples 16 or 17, and optionally further includes wherein a number of the one or more additional bits are selected to minimize overlap between distributions of read electrical parameters.

Example 19 includes the subject matter of any one of Examples 16-18, and optionally further includes an electrical parameter reference generator coupled to the memory controller logic, the reference generator to generate the base reference and the predetermined interval, wherein the predetermined interval corresponds to a threshold between a selected electrical parameter level from the plurality of levels, and a discrete electrical parameter level that is immediately below the selected electrical parameter level.

Example 20 includes the subject matter of any one of Examples 16-19, and optionally further includes wherein the electrical parameter comprises at least one of: current, charge, or voltage.

What is claimed is:

1. An apparatus comprising:
  a non-volatile memory to store a read current that indicates synaptic weight data for an artificial neural network (ANN); and
  logic coupled with the memory, wherein the logic is to:
    convert the synaptic weight data when input into the logic to generate a base current and an interval current, wherein the base current provides a lower bound current level for the read current, and a combination of the base and interval currents provides an upper bound level for the read current, and wherein the read current indicates the synaptic weight data; and
    repeatedly write into the memory, to generate an incremental change in a response current of the memory, until the response current is provided between the lower and upper bound levels for the read current, wherein the response current comprises the read current that indicates the synaptic weight data.

2. The apparatus of claim 1, wherein the synaptic weight data correlates to one of a plurality of binary numbers defined by a fixed number of bits, each of the plurality of binary numbers corresponding to a discrete read current level.

3. The apparatus of claim 2, wherein the logic comprises a current reference generator to generate the base current and interval current.

4. The apparatus of claim 3, wherein the current reference generator comprises a switched transistor ladder configured to generate a plurality of base current levels, each corresponding to one of the plurality of binary numbers, and wherein the interval current is generated from a selected one of the plurality of base current levels and an additional bit to generate additional current levels between each of the plurality of base current levels.

5. The apparatus of claim 4, wherein the fixed number of bits plus the additional bit are selected to minimize current distribution overlap between the discrete read current levels.

6. The apparatus of claim 1, wherein the non-volatile memory is at least one of a resistive random access memory, ferro-electric field effect transistor (FET) memory, indium gallium zinc oxide FET memory, or phase change memory.

7. The apparatus of claim 1, wherein the logic comprises a memory controller to iteratively write and iteratively read in synchronization with a clock.

8. The apparatus of claim 7, wherein the memory controller further comprises a pulse generator to create a current pulse to generate the incremental change in the response current of the memory.

9. The apparatus of claim 1, wherein the non-volatile memory is adapted to implement compute-in-memory.

10. A method, comprising:
    generating a base current to provide to a non-volatile memory capable of storing a plurality of discrete current levels, wherein the discrete current levels correspond to synaptic weights to be provided to an artificial neural network (ANN);
    generating an interval current above the base current, based at least in part on the generated base current;
    calculating a ceiling current that is the sum of the base current and interval current;
    reading a current from a memory cell of a non-volatile memory;
    writing repeatedly, while the current from the memory cell is less than the ceiling current, a voltage to the memory cell that induces the current read from the memory cell to incrementally increase; and
    stopping the writing when the current from the memory cell exceeds the base current,
    wherein the base current is generated based upon a selected discrete current level, from the plurality of discrete current levels, that corresponds to a provided synaptic weight.

11. The method of claim 10, wherein each of the plurality of discrete current levels correspond to one of a plurality of discrete levels expressed by a number of bits, and wherein the interval current is determined at a level expressed by the number of bits plus one or more additional bits.

12. The method of claim 11, wherein a number of the one or more additional bits are selected to minimize overlap between read current distributions.

13. The method of claim 10, further comprising generating a clock signal, and wherein the voltage is written to the non-volatile memory in synchronization with the clock signal.

14. The method of claim 10, wherein generating the base current comprises selecting, from a transistor-based current reference generator, a base current corresponding to a threshold between a selected discrete current level from the plurality of discrete current levels, and a discrete current level that is immediately below the selected discrete current level.

15. The method of claim 14, wherein the interval current is a predetermined amount equal to:
    half a current differential between the selected discrete current level, and
    a next discrete current level, from the plurality of discrete current levels, that is above the selected discrete current level.

16. A computing device, comprising:
    a processor;
    a multi-level memory coupled to the processor, the memory adapted to store a level of a plurality of levels of an electrical parameter that indicates a synaptic weight for an artificial neural network; and
    memory controller logic coupled to the processor and the memory,
    wherein the memory controller logic is configured to:
        generate a base reference of the electrical parameter;
        generate a ceiling reference of the electrical parameter that is a predetermined interval above the base reference;
        read a stored electrical parameter from the multi-level memory;
        write repeatedly, while the stored electrical parameter from the memory is less than the ceiling reference, an electrical signal to the memory that causes the stored electrical parameter in the memory to incrementally increase; and
        discontinue the write when the stored electrical parameter is greater than the base reference.

17. The computing device of claim 16, wherein each of the plurality of levels correspond to one of a plurality of discrete levels expressed by a number of bits, and wherein the predetermined interval is determined as a level expressed by the number of bits plus one or more additional bits.

18. The computing device of claim 17, wherein a number of the one or more additional bits are selected to minimize overlap between distributions of read electrical parameters.

19. The computing device of claim 16, further comprising an electrical parameter reference generator coupled to the memory controller logic, the reference generator to generate the base reference and the predetermined interval, wherein the predetermined interval corresponds to a threshold between a selected electrical parameter level from the plurality of levels, and a discrete electrical parameter level that is immediately below the selected electrical parameter level.

20. The computing device of claim 16, wherein the electrical parameter comprises at least one of: current, charge, or voltage.

* * * * *